United States Patent [19]

Matsumoto et al.

[11] Patent Number: 5,290,395
[45] Date of Patent: Mar. 1, 1994

[54] METHOD OF AND APPARATUS FOR PREPARING SINGLE CRYSTAL

[75] Inventors: Kazuhisa Matsumoto, Hyogo; Masami Tatsumi; Tomohiro Kawase, both of Osaka, all of Japan

[73] Assignee: Sumitomo Electric Industries, Ltd., Osaka, Japan

[21] Appl. No.: 838,776

[22] PCT Filed: Jul. 24, 1991

[86] PCT No.: PCT/JP91/00987
§ 371 Date: Mar. 17, 1992
§ 102(e) Date: Mar. 17, 1992

[87] PCT Pub. No.: WO92/01826
PCT Pub. Date: Feb. 6, 1992

[30] Foreign Application Priority Data

Jul. 26, 1990 [JP] Japan ................. 2-198133
Sep. 28, 1990 [JP] Japan ................. 2-260708
Oct. 18, 1990 [JP] Japan ................. 2-281032

[51] Int. Cl.$^5$ ............................. C30B 15/12
[52] U.S. Cl. ............ 156/617.1; 156/DIG. 115; 222/132; 222/135; 422/249; 422/253
[58] Field of Search ....... 156/617.1, 618.1, DIG. 115; 222/132, 135, 145; 422/249, 253

[56] References Cited

U.S. PATENT DOCUMENTS

| | | | |
|---|---|---|---|
| 2,892,739 | 6/1959 | Rusler ............ | 156/DIG. 115 |
| 2,977,258 | 3/1961 | Dunkle . | |
| 3,926,344 | 12/1975 | Bradley et al. ........... | 222/145 |
| 4,454,096 | 6/1984 | Lorenzini et al. ............ | 422/249 |
| 4,474,310 | 10/1984 | Müller et al. ............ | 222/145 |
| 4,547,258 | 10/1985 | Witter et al. ............ | 156/DIG. 115 |
| 4,650,540 | 3/1987 | Stoll . | |
| 4,659,421 | 4/1987 | Jewett . | |
| 4,938,837 | 7/1990 | Tada et al. ............ | 156/617.1 |
| 5,037,503 | 8/1991 | Kajimoto et al. ............ | 422/249 |

FOREIGN PATENT DOCUMENTS

| | | |
|---|---|---|
| 0149898 | 7/1985 | European Pat. Off. . |
| 3806918 | 9/1989 | Fed. Rep. of Germany . |
| 59-79000 | 5/1984 | Japan . |
| 60-137891 | 7/1985 | Japan . |
| 612-158896 | 7/1986 | Japan . |
| 61-158897 | 7/1986 | Japan . |
| 3-232789 | 10/1991 | Japan . |
| 86/03523 | 6/1986 | PCT Int'l Appl. . |
| 755422 | 8/1956 | United Kingdom . |
| 1353917 | 5/1974 | United Kingdom . |
| 2147223 | 5/1985 | United Kingdom . |
| 2180469 | 4/1987 | United Kingdom . |

*Primary Examiner*—Olik Chaudhuri
*Assistant Examiner*—Felisa Garrett
*Attorney, Agent, or Firm*—W. G. Fasse

[57] ABSTRACT

A method and an apparatus for pulling a compound single crystal from a raw material molten solution is constructed to cause the solution to flow into a second crucible provided in a first crucible containing the raw material molten solution which is continuously synthesized from a plurality of raw materials, through a communicating hole formed in the bottom portion of the second crucible. The single crystal is pulled while the raw material molten solution is continuously synthesized from the plurality of raw materials, whereby it is possible to pull a long single compound crystal through a single pulling step from the raw material molten solution which is contained in the second crucible. An excellent state of a solid-liquid interface is maintained to obtain a quality single crystal.

20 Claims, 5 Drawing Sheets

METHOD OF AND APPARATUS FOR PREPARING SINGLE CRYSTAL

FIELD OF THE INVENTION

The present invention relates to a method of and an apparatus for preparing a single crystal of a group III and V compound semiconductor such as GaAs, InP or the like, a group II and VI compound semiconductor such as CdTe, ZnSe or the like, an oxide containing a volatile constituent, or the like.

BACKGROUND OF THE INVENTION

A compound semiconductor single crystal is generally prepared by a horizontal Bridgeman method (HB method) or a liquid encapsulated Czochralski method (LEC method).

When a single crystal is prepared according to the LEC method, such a single crystal is pulled by a rotary pulling shaft from a raw material molten solution having a surface covered with a liquid sealant. An apparatus for such pulling comprises an airtight housing, a rotatable, vertically movable upper shaft having a lower end on which a seed crystal is mounted, a crucible for containing a raw material, a lower shaft for supporting the crucible, an evacuator, an inert gas introducing system, a heater, and the like. In such apparatus, the upper and lower shafts are rotated for providing uniform temperature conditions in the direction of rotation. In addition, the raw material molten solution is covered with a liquid sealant and supplied with a high pressure inert gas, in order to suppress decomposition and evaporation of a raw material element having a high vapor pressure near its melting point.

When a single crystal of a compound semiconductor or the like is prepared by a pulling method, generally employed is a method of filling up a crucible with a raw material polycrystal or a raw material single element or impurity only once at the start and supplying no raw material in an intermediate stage. In such a method, the size of the pulled single crystal is inevitably restricted by the amount of the raw material which is filled into the crucible at the start. In an apparatus for carrying out such a method, the raw material molten solution contained in the crucible is reduced as the pulling proceeds. When the quantity of the molten solution is less than a prescribed value, it is no longer possible to pull a single crystal. If a long single crystal can be grown through single pulling, it is possible to reduce loss at each end of the crystal, while it is also possible to reduce time loss in a preparation step for the crystal growth, an extraction step after the growth and the like. Thus, the cost can be remarkably reduced as compared with a case of growing short crystals repeatedly.

In order to pull a longer single crystal through a single growth step, the crucible must be continuously supplied with the raw material. As to a method of pulling a silicon single crystal, methods enabling a continuous supply of raw materials have been proposed in British Patent No. 755,422 (Aug. 22, 1956), Japanese Patent Laying-Open No. 59-79000 (May 8, 1984), U.S. Pat. No. 4,659,421 (Apr. 21, 1987), U.S. Pat. No. 2,977,258 (Mar. 28, 1961) and U.S. Pat. No. 4,650,540 (Mar. 17, 1987), for example.

Each of these methods utilizes a wide crucible to pull a single crystal from a certain pulling region of the crucible while dissolving a solid raw material in another region of the crucible for supplying the same into the pulling region. When the supply quantity of the solid raw material is substantially equal to the pulling quantity, the crucible is regularly provided therein with a constant quantity of the raw material molten solution. Thus, it is possible to pull a silicon single crystal until the solid raw material is used up or the pulling reaches the geometrical limit of the upper shaft in the apparatus. Since it is possible to grow a sufficiently long ingot of a silicon single crystal, the cost for preparing the single crystal can be reduced.

Each of these apparatuses is adapted to pull a single crystal from and supply a solid raw material into the same crucible. The crucible is formed to have a wide surface area and a thin bottom. While the crucible is rotatable about its central axis, the center of the pulling shaft is not aligned with that of the lower shaft supporting the crucible. However, the temperature of the raw material molten solution is uniformalized by stirring since the crucible is being rotated. In the case of a silicon single crystal, it is possible to relatively easily grow a long single crystal by supplying a raw material simultaneously with pulling, as described above. In practice, a silicon single crystal for a wafer of 152 mmU or 203 mmU having a length of at least 1m has been pulled by such a method.

In the case of a group III and V compound semiconductor single crystal, however, it is difficult to apply the aforementioned method In general, the surface of a raw material molten solution is covered with a liquid sealant in order to suppress dissociation of a group V element having a high vapor pressure In order to supply a solid raw material as described above, it is necessary to prevent evaporation of the group V element from this solid. Therefore, the solid raw material to be supplied must be covered with a liquid sealant, for example.

*1* Japanese Patent Laying-Open No. 61-158897 (application filed on Dec. 29, 1984) and *2* Japanese Patent Laying-Open No. 60-137891 (application filed on Dec. 24, 1983) by the applicants discloses methods or apparatuses for preparing single crystals of groups III and V compound semiconductors. FIG. 4 schematically illustrates a concrete example of apparatuses proposed in the above specifications A rotatable crucible 60 contains a GaAs molten solution 61 and $B_2O_3$ 62 serving as a liquid sealant. This crucible 60 is rotatably supported by a lower shaft. A GaAs single crystal 63 is pulled from the GaAs molten solution 61. A cylinder 64 is provided in a peripheral edge portion of the crucible 60. This cylinder 64 is dipped into the molten solution 61, while a polycrystalline rod 66 of GaAs is inserted therein. The polycrystalline rod 66 is entirely covered with a liquid sealant 65 which is filled into the cylinder 64. Further, an auxiliary heater 68 is provided around the cylinder 64, in order to prevent solidification of the liquid sealant 65. In this apparatus, supply of the raw material molten solution is carried out by gradually moving down the polycrystalline rod 66 and dissolving the same into the molten solution 61. The aforementioned specification *1* shows that a long non-doped GaAs single crystal is pulled while a continuous supply of a raw material takes place. The specification *2* shows that an increase in the impurity concentration was prevented by the supply of a non-doped polycrystal in order to uniformly dope an impurity having a segregation coefficient of not more than 1.

Further, *3* Japanese Patent Laying-Open No. 61-158896 (application filed on Dec. 29, 1984) discloses a method and an apparatus in which Ga and As are added to a raw material molten solution from different paths in place of a solid raw material. FIG. 5 is a typical diagram showing a concrete example of an apparatus described in this specification. A container 71 containing As is mounted under a crucible 70. A small hole 72 is formed in the bottom portion of the crucible 70, in order to introduce As vapor from the container 71. As is supplied into a raw material molten solution 73 through the small hole 72. A Ga container 74 is provided above the crucible 70. In the crucible 70, the supplied As and Ga react with each other to provide a GaAs molten solution. A single crystal is directly pulled from the raw material molten solution synthesized in such a manner.

In each of the methods and apparatuses shown in the above specifications *1* and *2*, it is necessary to perform a prior synthesizing of a polycrystal serving as a raw material to be supplied into the melt. Since the raw material to be supplied is solid, the following disadvantages take place:

(1) The cost for synthesizing a group III and V compound semiconductor raw material is increased.

(2) During the step of synthesizing the supplied polycrystalline raw material may entrap impurities Thus, the raw material molten solution may be contaminated with such impurities contained in the raw material being supplied.

(3) In the apparatus shown in FIG. 4, the raw material solid to be supplied must be sealed in the cylinder with the liquid sealant. Due to geometrical limitations of such a sealing mechanism, the solid to be supplied may not be much increased in size. Since the supply quantity of the raw material is thus limited, the length of the pulled single crystal is also limited.

(4) In the pulling apparatus, a supply mechanism, an auxiliary heater and the like must be arranged in a narrow space above the crucible, and hence the apparatus is complicated in structure.

In the method shown in specification *3*, no expense is required for a prior synthesizing of a polycrystalline raw material since the supply raw material is directly synthesized in the apparatus. However, the method has the following problems:

(1) Heat generated in the synthesis of the raw material molten solution in the crucible disturbs the temperature environment in the molten solution. This exerts a bad influence on the state of the solid-liquid interface.

(2) It is difficult to form a small hole which allows passage of As vapor with no leakage of the raw material molten solution from the bottom portion of the crucible.

(3) While the synthesis quantity of the raw material molten solution is controlled by the supply quantity of Ga, it is difficult to stoichiometrically control As.

OBJECTS OF THE INVENTION

An object of the present invention is to solve the aforementioned problems and to provide a method and an apparatus which can prepare a single crystal that is longer than a conventionally produced single crystal and the production shall take place in a single step at a cost lower than that for the conventionally produced single crystal.

Another object of the present invention is to provide a method and an apparatus which can pull a long compound semiconductor single crystal while preventing the aforementioned contamination by impurities.

Still another object of the present invention is to provide a method which can pull a particularly long compound semiconductor single crystal with an apparatus having a simpler structure.

A further object of the present invention is to provide a method and an apparatus which can pull a particularly long compound semiconductor single crystal from a raw material solution that is being maintained in a stoichiometric composition with an excellent state of a solid-liquid interface.

SUMMARY OF THE INVENTION

A method of preparing a single crystal according to the present invention is characterized by preparing a single crystal from a raw material molten solution, which is synthesized from a plurality of raw materials, by a pulling method wherein the single crystal is pulled from the raw material molten solution flowing into a second crucible provided in a first crucible containing the raw material molten solution that is being continuously synthesized from the plurality of raw materials through a communicating hole formed in the second crucible.

According to this method, the raw material molten solution is continuously synthesized from a plurality of raw materials. The synthesized raw material molten solution is contained in the first crucible. The raw material molten solution contained in the first crucible flows into the second crucible through the communicating hole formed in the second crucible. A single crystal is pulled from the raw material molten solution contained in the second crucible. The quantity of the raw material molten solution contained in the first crucible is reduced while pulling the single crystal and while a newly synthesized raw material molten solution is supplied into the first crucible. Therefore, the quantities of the raw material molten solutions contained in the first and second crucibles are maintained in constant ranges. Since the raw material is continuously supplied in such a manner, it is possible to pull a long single crystal through a single pulling step. Thus, the cost for preparation of the single crystal is reduced. In addition, it is not necessary to synthesize a polycrystalline raw material to be supplied, dissimilarly to the conventional case, whereby the costs for preparing such a supply raw material is reduced. Further, there is no possibility that the raw material molten solution is contaminated by impurities contained in the supplied raw material, dissimilarly to the conventional case. Disadvantages such as vibration of the molten solution, a non-uniform temperature distribution of the molten solution and the like of the raw material molten solution contained in the first crucible are avoided by and in the second crucible. Further, the state of the solid-liquid interface is excellent when the single crystal is pulled from the raw material molten solution contained in the second crucible, as compared with the first crucible. The crystal is thus pulled from the second crucible, whereby a bad influence such as generation of a twin or a dislocation on the crystal growth is suppressed. In addition, it is possible to rotate the second crucible in order to improve the state of the raw material molten solution contained in the second crucible. As described above, it is possible to pull a long single crystal having a high purity and a low dislocation density.

The method according to the present invention is particularly suitable for pulling a compound single crystal containing a high dissociation pressure component, such as a group III and V compound seimconductor or the like. When the raw material contains a high dissociation pressure component, the single crystal is preferably pulled in a closed space. Further, liquid sealants may be provided on the raw material molten solutions which are contained in the first and second crucibles.

The raw material molten solution may be synthesized in a third crucible, by supplying a plurality of raw materials into the third crucible respectively. In this case, it is preferable to continuously supply the raw material molten solution from the third crucible into the first crucible Particularly when the raw materials contain high dissociation pressure components, synthesis of the raw material molten solution in the third crucible is preferably carried out in a closed space which is not in contact with an atmosphere, for pulling a single crystal. When the raw materials contain high dissociation pressure components, a liquid sealant should be provided on the liquid which is contained in the third crucible.

On the other hand, the raw material molten solution may alternatively be synthesized in the first crucible by supplying a plurality of raw materials into the first crucible respectively. In this case, it is preferable to rotate the first crucible. Further, synthesis of the raw material molten solution in the first crucible is preferably carried out in a closed space which is in common with an atmosphere for pulling a single crystal.

A single crystal preparation apparatus according to the present invention for practicing the present method, comprises a plurality of raw material containers for containing a plurality of raw materials respectively, a mixing crucible for mixing the raw materials therein for synthesizing a raw material molten solution, a piping system for feeding the raw materials from the raw material containers to the mixing crucible, a storage crucible for storing the synthesized raw material molten solution while pulling a single crystal, an inner crucible provided in the storage crucible and having a communicating hole in its bottom portion for introducing the raw material molten solution into the inner crucible, a heater provided around the storage crucible controlling the temperature of the raw material molten solution contained in the storage crucible, and a rotatable and/or vertically movable crystal pulling shaft for pulling a single crystal from the raw material molten solution flowing into the inner crucible.

The apparatus according to the present invention may comprise an airtight housing for pulling the single crystal under an atmosphere closed off from the atmospheric air.

The apparatus according to the present invention may further comprise heaters for heating the raw materials in the respective raw material containers.

The apparatus according to the present invention may further comprise rotation means for rotating the aforementioned inner crucible about a rotary shaft whose center is substantially in conformity to that of the crystal pulling shaft.

The piping system according to the present invention may further comprise a flow rate control mechanism for controlling the supply quantity of the raw materials.

The storage crucible according to the present invention may be identical to the mixing crucible. In other words, the storage crucible can also serve as the mixing crucible in the apparatus according to the present invention. In this case, the storage crucible or mixing crucible is preferably rotatably supported by a lower shaft.

On the other hand, the storage crucible may be independent of the mixing crucible. In this case, the storage crucible and the mixing crucible may be connected with each other by a pipe. A heater may be provided around the mixing crucible. In addition, the mixing crucible may be covered with an airtight housing, in order to carry out synthesis of the raw material molten solution in the mixing crucible in a closed space which is closed off against atmospheric air for pulling a single crystal. A heater may be provided around this airtight housing.

DETAILED DESCRIPTION OF PREFERRED EXAMPLE EMBODIMENTS AND OF THE BEST MODE OF THE INVENTION

Figure 1:
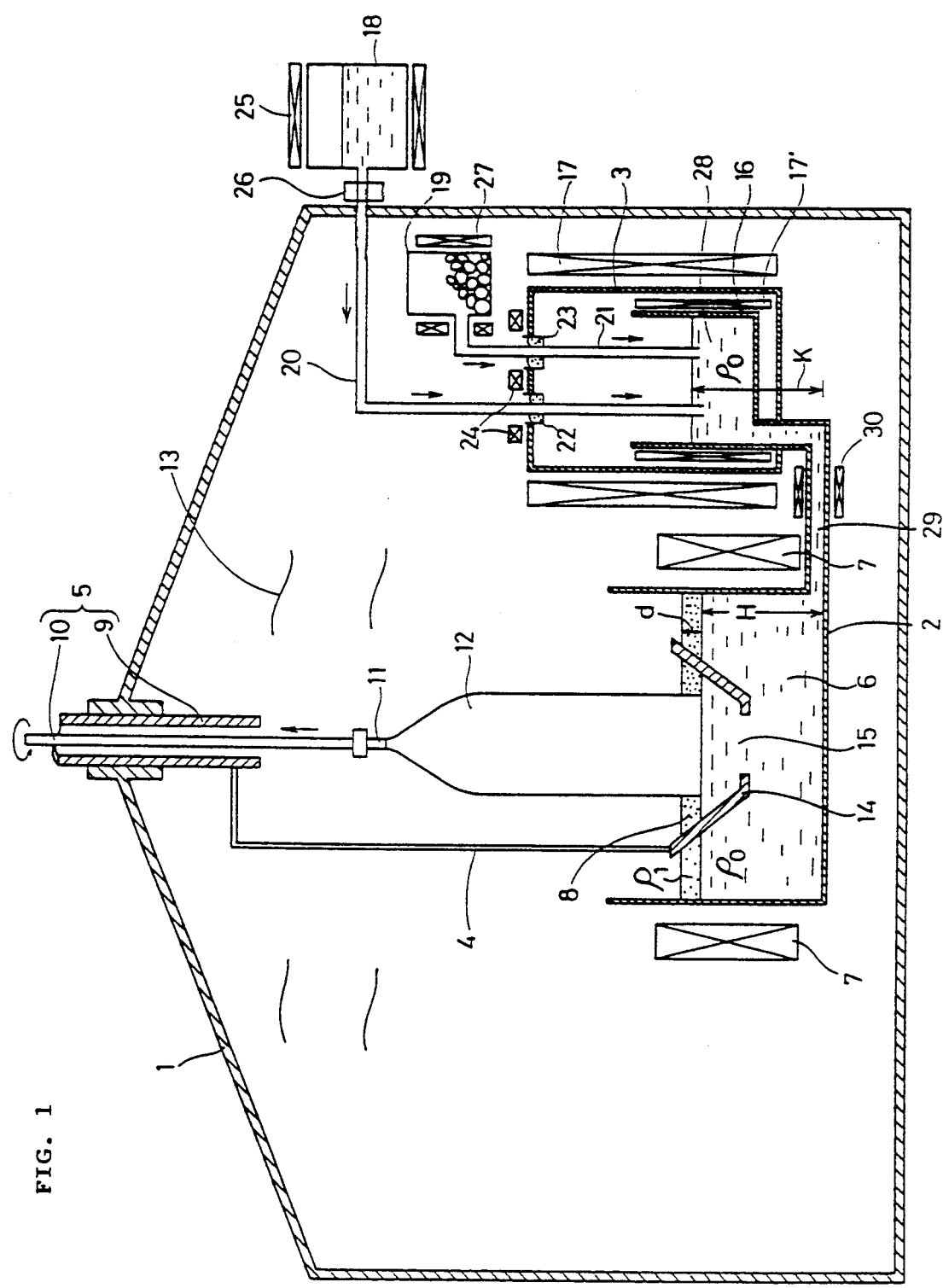
FIG. 1 is a typical diagram showing a single crystal preparation apparatus which is employed in a first embodiment according to the present invention.

A first embodiment according to the present invention is now described. Referring to FIG. 1, a pulling furnace 1 comprises a housing from which vapor contained in its interior can be withdrawn by a vacuum pump. The housing may be filled with a gas at a high pressure. A crucible 2 for storing a raw material molten solution, a closed housing 3, a container 19 for containing a group V raw material, a pulling shaft 5 and the like are provided in the pulling furnace 1. The crucible 2 contains a group III and V raw material molten solution 6. The molten solution 6 is heated by a main heater 7 positioned around the periphery of the crucible 2. The surface of the raw material molten solution 6 is covered with a liquid sealant 8. The pulling shaft 5 has a double structure including an outer shaft 9 and an inner shaft 10 having a common axis of rotation. Both shafts are independently rotatable and vertically movable. A seed crystal 1 is mounted on the lower end of the inner shaft 10. A single crystal 12 is pulled by the inner shaft 10.

Similarly to a general LEC method, an inert gas 13 under a high pressure is filled into the interior of the pulling furnace 1. The high pressure of the inert gas 13 is applied to the liquid sealant 8 whereby dissociation of the group V element from the surface of the raw material molten solution 6 is inhibited. On the other hand, the crucible 2, which must be rotated in a conventional pulling method, is fixed according to the invention. Since the temperature distribution from the center toward the outer periphery in the raw material molten solution 6 is ununiformalized in this state, an inner crucible 14 is dipped into the raw material molten solution 6 in the crucible 2. The inner hole 15 in its center. This inner crucible 14 is coupled to the outer shaft 9 by a suspending jig 4, whereby it is possible to rotate the inner crucible 14 by rotating the outer shaft 9. Since the raw material molten solution 6 is rotated by the rotation of the inner crucible 14, it is possible to stably attain a substantially rotation-symmetrical temperature distribution in the raw material molten solution.

A mixing crucible 16 is provided in the closed housing 3. The raw materials are mixed with each other in the crucible 16, for synthesizing the raw material molten solution. A heater 17 is positioned around the outer periphery of the closed housing 3. Another heater 17' is positioned around the crucible 16 in the closed housing 3. A container 18 holding a group III raw material (Ga, In or the like) is positioned outside the pulling furnace 1. Another container 19 holding a group V raw material (P, As, Sb or the like) is provided inside the pulling furnace 1. The group III raw material contained in liquid form in the container 18 is supplied into the crucible 16 through a pipe 20. The group V raw material contained as a gas or liquid in the container 19 is supplied into the crucible 16 through another pipe 21. Sealing members 22 and 23 containing liquid sealants in dish-type containers having holes are provided in portions around the pipes 20 and 21 passing through the upper wall of the closed housing 3. The sealing members 22 and 23 maintain sealed states while allowing passage of the pipes 20 and 21 respectively. Heaters 24 for heating the liquid sealants are provided in the vicinity of the sealing members 22 and 23.

A heater 25 for heating the raw material as needed is provided in the vicinity of the container 18 for the group III raw material. Further, a flow control mechanism for example a flow control valve 26 is provided in the pipe 20 close to an exhaust port of the container 18, so that it is possible to freely adjust the supply quantity.

A heater 27 for heating the group V raw material is provided in the vicinity of the container 19. The group V raw material (P or As, for example) which is contained in the container 19 in a solid state is sublimated by heating, whereby the resulting group V gas raw material enters the crucible 16 through the pipe 21. Since the vapor pressure of the group V raw material is determined by the heating temperature, it is possible in this case to adjust the supply quantity of the raw material by the heater.

Although the container 19 for the group V raw material is provided in the interior of the pulling furnace 1 in the apparatus shown in FIG. 1, the container 19 may alternatively be positioned outside of the furnace 1. On the other hand, the container for the group III raw material, which is shown outside of the furnace 1, may alternatively be positioned in the container. The gas or liquid of the group V raw material and the liquid of the group III raw material which are mixed in the crucible 16, react with each other at an appropriate temperature, to form a group III and V compound. This compound is held in the crucible 16 in a state of a molten solution 28. The molten solution 28 enters the crucible 2 at the bottom through a communicating tube 29 which connects the crucible 2 with the crucible 16. Thus, the newly synthesized raw material is supplied to the crucible 2 through the communicating tube 29. A heater 30 is also provided around the communicating tube 29.

The relationship between the vertical positions of the raw material molten solutions which are contained in the crucibles 2 and 16 respectively, is determined on the basis of pressure balance conditions. It is possible to supply the crucible 2 with a constant quantity of the raw material molten solution by supplying the crucible 16 with proper quantities of the group III raw material and the group V raw material. When the single crystal 12 is pulled, it is possible to maintain the vertical position of the liquid surface in the crucible 2 constant by equalizing the supply quantity of the raw material molten solution to the consumption for pulling. In this case, the following equality holds assuming that dS/dt represents single crystal pulling weight in a unit time and dQ/dt represents the weight of the supplied raw material:

$$\frac{dS}{dt} = \frac{dQ}{dt} \tag{1}$$

At this time, the vertical elevations of the liquid surfaces in the crucibles 2 and 16 remain unchanged.

The relationship between the vertical elevations of the liquid surfaces is provided as follows: Suppose that H represents the vertical elevation of the surface of the raw material molten solution 6 contained in the crucible 2 and K represents the vertical elevation of the surface of the molten solution 28 in the crucible 16 relative to the bottom of the crucible 2. Suppose that d represents the thickness of the liquid sealant 8 in the crucible 2. Suppose that $\rho_0$ represents the density of the raw material molten solution, and $\rho_1$ represents the partial pressure of the inert gas ($N_2$, Ar, Ne or the like) contained in the internal space of the pulling furnace 1, and $Q_0$ represents the gas partial pressure of the group V element. $P_0$ is further greater than $Q_0$. Suppose that $P_1$ represents the partial pressure of the inert gas contained in the internal space of the closed housing 3, and $Q_1$ represents the gas partial pressure of the group V element. Suppose that $\Delta$ represents the difference between the internal and external pressures in the sealing members 22 and 23. Suppose that $\Delta > 0$ when the internal pressure of the closed housing 3 is high. Under the aforementioned conditions, a pressure balance is provided by the following equation:

$$P_0 + Q_0 + \rho_1 dg + \rho_0 Hg = P_1 + Q_1 + \rho_0 Kg - \Delta \tag{2}$$

In this equation, g represents gravitational acceleration. $\Delta$, which is restricted by the thickness of the liquid sealant and the diameters of the holes of the sealing portions etc., is not necessarily zero. If the pressures of the gases are identical and $\Delta = 0$, the following equation holds:

$$\rho_1 d = \rho_0(K - H) \tag{3}$$

The thickness d of the liquid sealant is constant since the same is determined by the quantity introduced in the crucible 2 at the start. If the vertical elevation K of the liquid surface of the raw material molten solution 28 contained in the crucible 16 is constant, the vertical elevation H of the liquid surface in the crucible 2 is constant. The condition that K and H are constant is the optimum mode for carrying out the present invention.

On the other hand, a mode of changing K is also possible. K and H may be constant when a non-doped single crystal is pulled, while it is better to reduce K at a constant rate when an impurity is doped. When a single crystal which is doped with an impurity having a segregation coefficient k of not more than 1 is pulled, the relation between the supply quantity and the pulling quantity may be set in accordance with the following equation in order to make the impurity concentration constant:

$$\frac{dQ}{dt} = (1-k)\frac{dS}{dt} \qquad (4)$$

The liquid surface is lowered little by little since the supply quantity is less than the pulling quantity. However, this change is slight when k is small. In this case it is also possible to pull a long single crystal.

Pulling of a non-doped GaAs single crystal using the aforementioned apparatus will now be described. The crucible 2 was formed by a PBN crucible having a diameter of 152 mm. The closed housing 3 was formed by a housing of carbon having inner and outer surfaces were coated with PBN. The crucible 2 was connected with the crucible 16 by a communicating tube which was made of PBN.

The container 19 for containing an As raw material was made of carbon and its inner surface was coated with PBN. The container 18 for containing a Ga raw material, which was provided outside of the pulling furnace 1, was made of carbon, and its inner surface was coated with PBN. The sealing members 22 and 23 contained proper quantities of liquid sealants ($B_2O_3$) respectively.

The inner crucible 14 was made of carbon and its surface was coated with PBN.

An operation for pulling a crystal will now be described. 5 kg of a GaAs polycrystal and 700 g of $B_2O_3$ were contained in the crucible 2. At this time, the polycrystal was so positioned that part of the GaAs polycrystal blocked the communicating tube 29.

The container 18 contained 5 kg of Ga. The container 19 contained 5.4 kg of As. The mole ratio of Ga to As, which were raw materials to be supplied, was 1:1.005. This ratio was in anticipation of loss of As resulting from dissociation.

A seed crystal 11 was mounted on the lower end of the inner shaft 10 of the pulling shaft 5. The inner crucible 14 was suspended from the outer shaft 9 through the suspending jig 4.

The gas contained in the pulling furnace 1 was discharged by a vacuum pump (not shown), and gaseous nitrogen was filled into the furnace at a prescribed pressure level. The closed housing 3 was entirely heated by the heater 17 and so controlled that a lowest temperature portion including the interior of the housing 3 was at 617° C. This is such a temperature that the vapor pressure of As is about 1 atm. The lowest temperature was set at 617° C., since the vapor pressure of As is determined by the lowest temperature in a closed space.

Then $B_2O_3$ and GaAs contained in the crucible 2 were melted by the main heater 7. The raw material molten solution of GaAs was covered with $B_2O_3$. A part of the raw material molten solution flowed into the crucible 16 through the communicating hole 29. The liquid level in the crucible 16 was raised and the lower ends of the pipes 20 and 21 were submerged in the molten solution.

The heaters 25 and 27 were energized to heat the Ga and As raw materials. The temperature of the container 19 was set at 617° C., and the temperature of the pipe 21 connected thereto was maintained at a temperature above 617° C. The flow rate control mechanism 26 was so adjusted that a proper quantity of the Ga raw material gradually flowed from the container 18.

Then, the vertical position of the outer shaft 9 was controlled to locate the inner crucible 14 in the raw material molten solution. The inner shaft 10 and the outer shaft 9 were rotated at speeds of 3 r.p.m. and 10 r.p.m. respectively in directions opposite to dip the seed crystal 11 into the raw material molten solution 6. After seeding, crystal growth was started. While the single crystal 12 of GaAs was grown under the seed crystal, the vertical position of the liquid surface of the raw material molten solution contained in the crucible 2 was maintained constant. At this time, a constant quantity of the Ga raw material was continuously supplied, while the As raw material was supplied as a gas of about 1 atm. As hereinabove described, the synthesis quantity of GaAs per unit time was balanced with the pulling quantity of the single crystal. The synthesis quantity was controlled by controlling the supply quantity of GaAs. So far as the As partial pressure was controlled to about 1 atm., the composition of the GaAs molten solution was stoichiometrically maintained. Through the aforementioned operation, a GaAs single crystal of 76 mm in diameter and 533 mm in length was grown. This was a long single crystal, which had been impossible to attain by the conventional method. This single crystal was entirely semiinsulative, and had uniform characteristics.

A second embodiment according to the present invention will to pull a single crystal in a pulling furnace 1 with an inner atmosphere of an inert gas 13. The pulling furnace 1 is provided with a crucible 2 for containing a raw material molten solution and another crucible 16 for synthesizing the molten solution respectively. The lower portion of the crucible 2 is connected with the lower portion of the crucible 16 by a communicating tube 29. Heaters 7 and 37 are arranged around these crucibles respectively. The crucible 2 contains a raw material molten solution 6, and is provided with an inner crucible 14. A communicating hole 15 is provided in the bottom portion of the inner crucible 14, so that the raw material molten solution 6 flows into the interior of crucible 14. On the other hand, a rotatable and/or vertically movable inner shaft 10 is suspended above the center of the crucible 2, and a seed crystal 11 is mounted on its lower end. A cylindrical outer shaft 9 is rotatably mounted to surround the inner shaft 10. The outer shaft 9 is connected with the inner crucible 14 by a suspending jig 4, so that the inner crucible 14 is rotated following rotation of the outer shaft 9. Both the inner shaft 10 and the outer shaft 9 pass through the upper portion of the pulling furnace 1. In the pulling furnace 1, an ampoule 39 for containing a raw material is provided above the crucible 16. The ampoule 39 is connected with a pipe 21, which extends into the crucible 16. A heater 27 is provided around the ampoule 39. Another ampoule 38 is positioned outside of the pulling furnace 1. This ampoule 38 is connected with a pipe 20, which extends into the crucible 16 through the pulling furnace 1. The portion around the pipe 20, which passes through the pulling furnace 1, is sealed.

A GaAs single crystal was grown using the apparatus having the aforementioned structure. First, 5 kg of a GaAs polycrystal and 700 g of a sealant $B_2O_3$ were contained in the crucible 2 having a diameter of 152 mm which was made of PBN. At the same time, 500 g of a sealant $B_2O_3$ was contained in the crucible 16. The ampoule 39 was made of carbon, and its inner surface was coated with PBN. 5.4 kg of As raw material was contained in the ampoule 39. The ampoule 38 was formed of carbon, and its inner surface was coated with PBN. 5 kg of Ga raw material was contained in the ampoule 38. Then, $N_2$ gas was filled into the pulling furnace 1 at a prescribed pressure, and the previously charged GaAs polycrystal and $B_2O_3$ were melted by the heaters 7 and 37. The molten solution contained in the crucible 2 flowed into the crucible 16 through the communicating tube 29.

The forward end portions of the pipes 20 and 21 were submerged in this molten solution. Then, the temperature of the ampoule 39 was set at 617° C. by the heater 27, and the temperature of the overall area of the As supply system was set at 617° C. also with a heater (not shown) provided around the pipe 21. In the aforementioned state, the positions of the inner shaft 10 and the outer shaft 9 were adjusted to dip the inner crucible 14 into the raw material molten solution 6. The inner shaft 10 and the outer shaft 9 were rotated at 3 r.p.m. and 10 r.p.m. respectively in directions opposite to each other, and the inner shaft 10 was moved down to dip the seed crystal 11 into the molten solution. The molten solution was controlled at a growth temperature by the respective heaters, and the inner shaft 10 was rotated and moved up to pull the single crystal. When the single crystal was pulled, Ga was continuously supplied from the ampoule 38 so that the level of the molten solution surface in the crucible 16 was not changed and As was supplied from the ampoule 39 as a gas at about 1 atm., as shown in the first embodiment. Thus, the stoichiometric composition of the raw material molten solution synthesized in the crucible 16 was continuously maintained constant.

A GaAs single crystal of 76 mm in diameter and 533 mm in length was grown according to the aforementioned step, whereby the as-obtained crystal was semi-insulative along its overall area and it had uniform characteristics.

Figure 3:
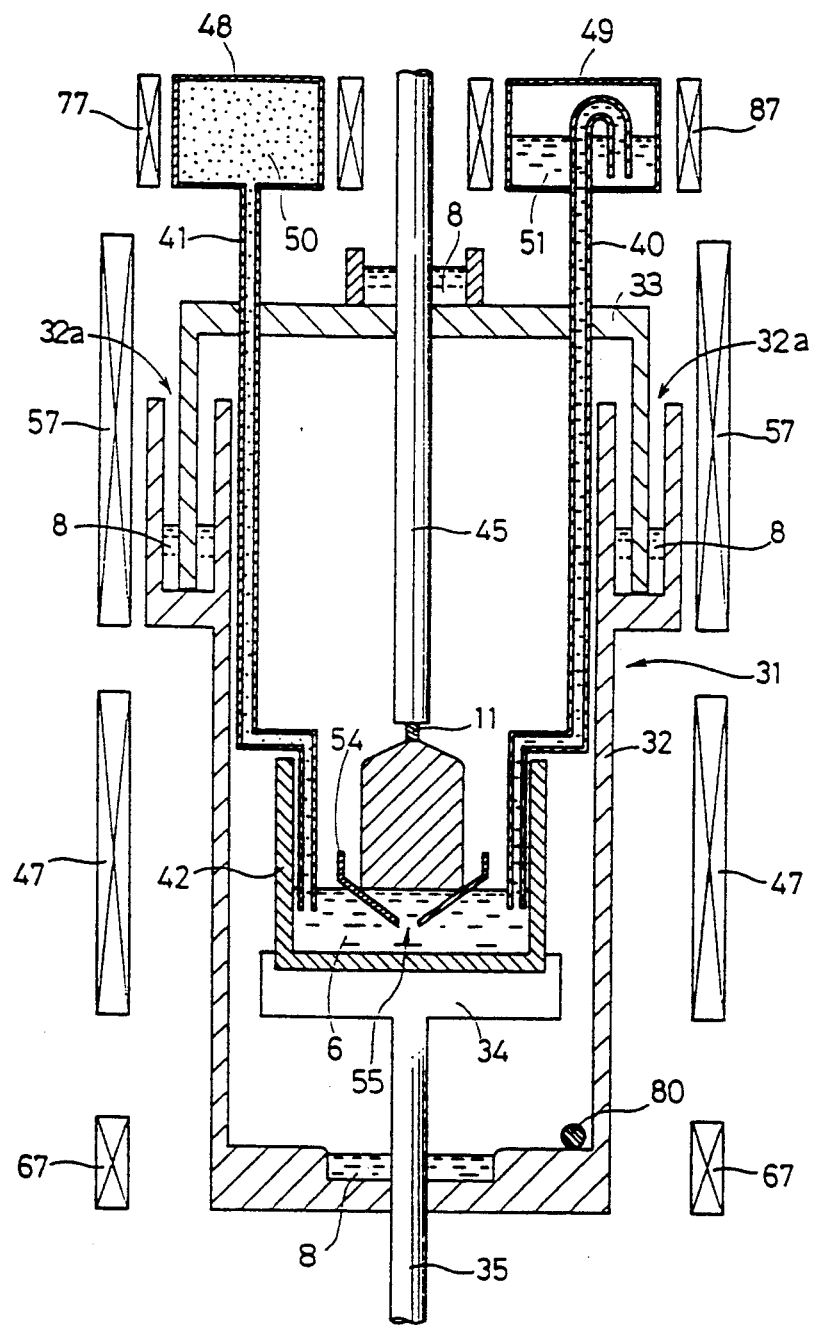
FIG. 3 is a typical diagram showing a single crystal preparation apparatus which is employed in a third embodiment according to the present invention.
Figure 4:
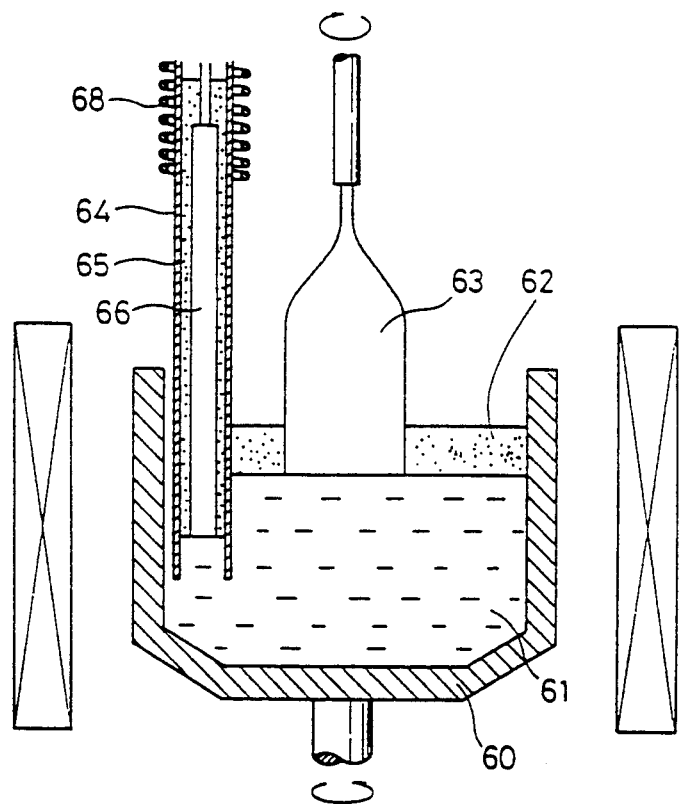
FIG. 4 is a typical diagram of a single crystal preparation apparatus which is shown in Japanese Patent Laying-Open Gazette No. 61-158897.
Figure 5:
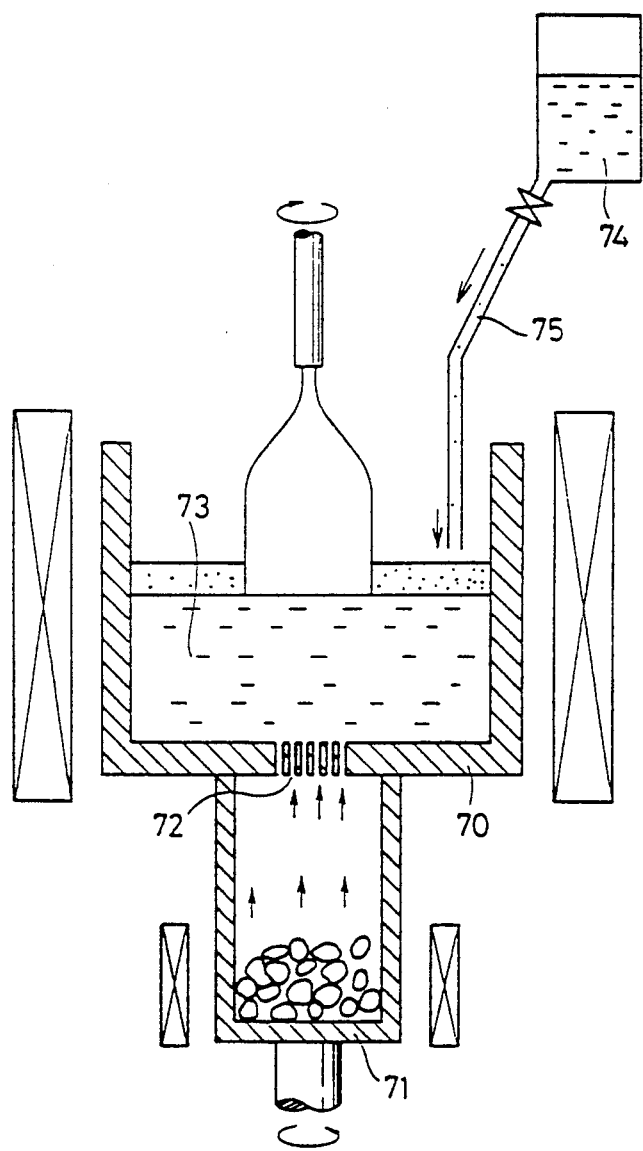
FIG. 5 is a typical diagram of a single crystal preparation apparatus which is shown in Japanese Patent Laying-Open Gazette No. 61-158896.

As shown in the first embodiment, the ampoule for supplying As may alternatively be positioned outside of the high-pressure housing also in the apparatus of the second embodiment. A third embodiment according to the present invention will now be described. Referring to FIG. 3, this apparatus is adapted to pull a single crystal in an airtight housing 31. The airtight housing 31 is formed by a cylindrical body 32 and a cover 33. The cover 33 engages into an annular groove portion 32a which is formed in the upper end portion of the body 32 and is sealed with a liquid sealant 8, to define a closed space. A rotatable lower shaft 35 passes through the bottom center of the body 32. The portion passed by the lower shaft 35 is sealed with a liquid sealant 8. The lower shaft 35 extends into the interior of the body 32 and a support portion 34 for supporting a crucible 42 is formed on the upper end of shaft 35. The crucible 42 on the support portion 34 contains a raw material molten solution 6 and is provided with an inner crucible 54. A communicating hole 55 is provided in the bottom portion of the inner crucible 54, so that the molten solution 6 flows into the interior of crucible 54. A rotatable and/or vertically movable upper shaft 45 is provided above the center of the crucible 42 and a seed crystal 11 is mounted on the forward or lower end of the upper shaft 45. The upper shaft 45 passes through the upper portion of the cover 33, and the passed portion is sealed with a liquid sealant 8. A high dissociation pressure element 80 in the raw material molten solution is stored in the bottom portion of the body 32. Heaters 57, 47 and 67 are provided around the airtight housing 31 for controlling the temperatures of the upper, intermediate and lower portions of the housing respectively.

Figure 2:
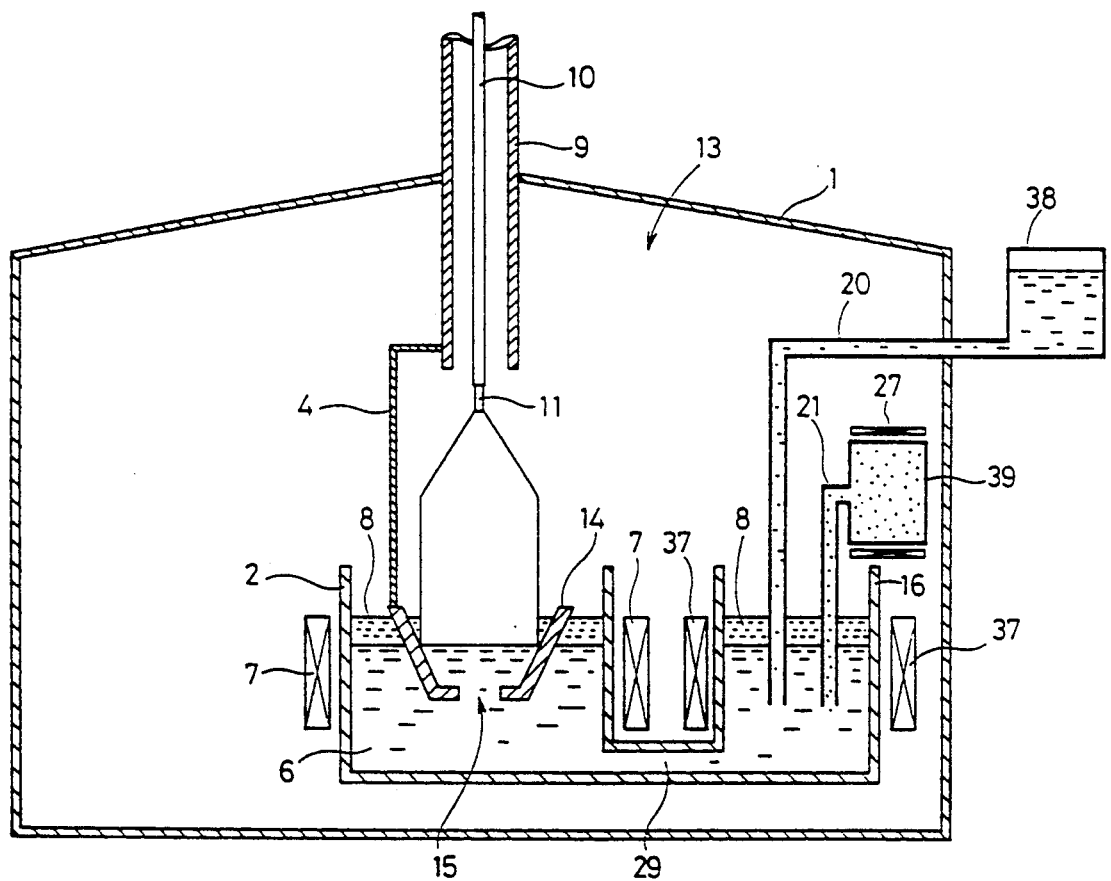
FIG. 2 is a typical diagram showing a single crystal preparation apparatus which is employed in a second embodiment according to the present invention.

In the apparatus of FIG. 2 having the aforementioned structure, ampoules 48 and 49 for containing raw materials for the molten solution are positioned outside and above the airtight housing 31. The ampoules 48 and 49 are connected with raw material supply tubes 41 and 40 respectively. The raw material supply tubes 41 and 40 pass through the cover 33 and extend into the crucible 42. Openings of the supply tubes are dipping into the molten solution 6 contained in the crucible 42 respectively. Heaters 77 and 87 are provided around the ampoules 48 and 49 respectively. The portions of the raw material supply tubes 40 and 41 passing through the cover portion 33 are sealed.

A GaAs single crystal was grown using the apparatus of FIG. 3 having the aforementioned structure. The crucible 42 made of BN had a diameter of 152 mm and was charged with 4 kg of a GaAs polycrystal serving as a raw material. The temperatures of the liquid sealants 8 in the respective sealed portions were raised to at least 500° C. to close the airtight housing 31, and thereafter the temperature around the crucible 42 was raised to 1300° C. by the heater 47. The raw material polycrystal was melted by such heating. The temperatures were set by the respective heaters so that the lowest temperature in the airtight housing 31 was not less than 617° C. On the other hand, As 50 was contained in the ampoule 48. Further, Ga 51 was contained in the ampoule 49. Then, the upper shaft 45 was moved down to dip the seed crystal 11 in the molten solution 6. After seeding, a single crystal was pulled. When the raw materials contained in the ampoules are liquids such as Ga, the raw materials may be supplied by application of pressure into the ampoules from the exterior by injecting an inert gas. These raw materials were mixed and synthesized in the crucible 42. Further, the As partial pressure in the airtight housing 31 was adjusted, thereby controlling the stoichiometric composition of the raw material molten solution.

A single crystal was pulled in the aforementioned manner, whereby a single crystal of 75 mm in diameter and 300 to 400 mm in length was obtained. It was possible to pull the crystal with a small temperature gradient, since the vapor pressure in the space for growing the crystal was controlled in this method. The dislocation density of the as-obtained single crystal was at an extremely low average value of not more than 300 cm$^{-2}$. Thus, a crystal having excellent characteristics was obtained. Further, a crystal having a homogeneous composition was obtained since the stoichiometric composition was controlled as to the raw material molten solution, as described above. In the so-obtained crystal, deposition of As was small while the E12 density was $1 \times 10^{16}$ cm$^{-3}$, which is not at all inferior to a high-quality crystal formed by a conventional LEC method.

When the raw materials are supplied from the ampoules in the form of gases in the aforementioned apparatus, the pressure of the gas in the airtight housing 31 is increased if the supplied raw material gases are evaporated from the molten solution surface. Such increase of the gas pressure facilitates the synthesis reaction on the surface of the molten solution. Therefore, it is possible to pull a single crystal of a desired composition by satisfactorily balancing the pressures of the supplied raw materials and the vapor pressure in the high-pressure housing.

Further, it is also possible to cover the molten solution surface with a liquid sealant $B_2O_3$ in the aforementioned apparatus. In this case, the gas evaporated from the raw material molten solution only unilaterally increases the pressure in the high-pressure housing, and cannot return into the molten solution. When the pressure in the housing is increased, therefore, the supply quantity of the raw material gas is reduced and hence the speed of reaction for synthesizing the raw material is reduced.

Although the inner crucible is so constructed that it floats on the molten solution in the aforementioned apparatus, such an inner crucible may alternatively be fixed to an outer crucible or the like.

According to the present invention, as hereinabove described, it is possible to pull a single crystal while supplying raw materials, whereby a long single crystal can be pulled without increasing the size of a crucible containing a raw material molten solution. Thus, the cost for manufacturing the single crystal is reduced. Further, there is no possibility of contamination caused by impurities resulting from a raw material crystal for supply, dissimilarly to the conventional case. Thus, a high-purity single crystal can be obtained. Further, the aforementioned raw material supply mechanism has a simple structure. In addition, it is possible to control the stoichiometric composition of the as-pulled single crystal by controlling the supply quantities of the raw materials.

In view of the aforementioned advantages, the present invention is particularly useful for growing a long single crystal of a compound semiconductor containing a high dissociation component or an oxide.

We claim:

1. A method of manufacturing a compound single crystal made of at least two initially separate starting material elements comprising the following steps:
   (a) supplying said starting material elements from respective separate containers into a synthesizing chamber forming a first crucible,
   (b) maintaining in said synthesizing chamber a controlled environment at a temperature for producing a melt,
   (c) continuously reacting and synthesizing said at least two starting material elements in said synthesizing chamber thereby producing a compound melt,
   (d) communicating a second crucible inside said first crucible with said first crucible to maintain a pool of said compound melt in said second crucible, said communicating taking place isolated from said reacting and synthesizing, whereby said second crucible isolates said pool of compound melt from any vibrations and non-uniform temperature distributions in said first crucible, and
   (e) pulling said compound single crystal from said compound melt in said pool, whereby synthesizing and pulling take place simultaneously.

2. The method of claim 1, further comprising dividing said first crucible into two sections, individually heating said two sections, and communicating said two sections with each other.

3. The method of claim 1, wherein said steps (b) and (e) are carried out in an enclosed common space so that synthesizing and pulling take place in a common atmosphere.

4. The method of claim 3, wherein at least one of said two starting material elements has a high dissociation pressure, and controlling the vapor pressure of said at least one element having said high dissociation pressure in said common atmosphere, (FIG. 3).

5. The method of claim 1, wherein at least one of said two starting material elements has a high dissociation pressure, and wherein said step (b) is performed to include controlling the vapor pressure of said at least one element having said high dissociation pressure in said controlled environment, (FIGS. 1 and 3).

6. The method of claim 1, further comprising rotating said second crucible inside said first crucible simultaneously with said pulling.

7. The method of claim 1, wherein said at least two raw material elements are selected from the group consisting of the elements of groups III and V of the periodic table.

8. The method of claim 1, further comprising covering said compound melt with a liquid sealant.

9. The method of claim 1, wherein said controlled environment of step (b) is maintained in an enclosed space closed off against atmospheric air.

10. An apparatus for producing a compound single crystal made of at least two starting material elements, comprising: at least two raw material containers for separately containing said at least two raw material elements, a first crucible for mixing said raw material elements in said first crucible for synthesizing said raw material elements to form a compound melt held in said first crucible, a piping system for feeding said raw material elements from said raw material containers into said first crucible, a second crucible inside said first crucible and means for communicating said second crucible with said first crucible to maintain a pool of compound melt in said second crucible, heating means for heating said first crucible for controlling the temperature of said compound melt, and a rotatable and vertically movable crystal pulling shaft for pulling said compound single crystal from said pool of compound melt out of said second crucible, whereby synthesizing and crystal pulling are simultaneously performable, and said second crucible substantially isolates said pool from the rest of said compound melt.

11. The apparatus of claim 10, comprising an airtight housing in which said first and second crucibles are mounted for pulling said compound single crystal under an atmosphere isolated from atmospheric air.

12. The apparatus of claim 10, further comprising heaters provided around said raw material containers for heating said raw material elements in said raw material containers.

13. The apparatus of claim 10, further comprising rotation means for rotating said second crucible inside said first crucible about a rotary shaft having a central axis substantially in axial alignment with a rotational axis of said crystal pulling shaft.

14. The apparatus of claim 10, wherein said piping system further comprises flow rate control means for controlling supply quantities of said raw material elements.

15. The apparatus of claim 10, wherein said first crucible is divided into a mixing and synthesizing section and into a storage section, thereby forming two sections of said first crucible, said apparatus further comprising means (29) communicating said sections with each other, and wherein said second crucible is positioned in said storage section of said first crucible.

16. The apparatus of claim 15, further comprising a heater provided around said mixing and synthesizing section of said first crucible.

17. The apparatus of claim 15, further comprising an airtight housing in which said mixing and synthesizing section of said first crucible is enclosed for carrying out a synthesis of said raw material elements in a closed space which is sealed relative to an atmosphere in which said storage section and said second crucible are positioned for pulling said compound single crystal.

18. The apparatus of claim 17, further comprising a heater provided around said airtight housing.

19. The apparatus of claim 10, further comprising a lower shaft for rotatably supporting said first crucible.

20. The method of claim 2, further comprising maintaining operating conditions including pressure conditions in said two sections of said first crucible so that melt levels (H and K) in both said first and second sections remain constant.

* * * * *

UNITED STATES PATENT AND TRADEMARK OFFICE
CERTIFICATE OF CORRECTION

PATENT NO. : 5,290,395
DATED : March 1, 1994
INVENTOR(S) : Kazuhisa Matsumoto et al.

It is certified that error appears in the above-identified patent and that said Letters Patent is hereby corrected as shown below:

On title page, item [56] "References Cited"
  please add: --US Patent 4,036,595  7/1977  Lorenzini et al.
           Japanese Pat. Application 59-8695    1/1984
           Japanese Pat. Application 63-57398   11/1988--;

Under "Foreign Patent Documents" line 5,
  please replace "612-158896   7/1986    Japan" by
            --61-158896    7/1986    Japan--;

Column 13, line 58, replace "and" by --to--.

On title page, item [54] "CRYSTAL" should read
            --CRYSTALS
Column 1, line 1, should be the same--

Signed and Sealed this

Twenty-sixth Day of July, 1994

*Attest:*

BRUCE LEHMAN

*Attesting Officer*        *Commissioner of Patents and Trademarks*